United States Patent
Inaguchi et al.

(10) Patent No.: US 7,554,173 B2
(45) Date of Patent: Jun. 30, 2009

(54) SEMICONDUCTOR DEVICE

(75) Inventors: Takashi Inaguchi, Tokyo (JP); Takeshi Ohi, Tokyo (JP); Katsuhiko Fukuhara, Tokyo (JP); Naoshi Yamada, Tokyo (JP); Yoshitsugu Inaba, Tokyo (JP); Takao Mitsuhashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 244 days.

(21) Appl. No.: 11/722,112

(22) PCT Filed: Dec. 19, 2005

(86) PCT No.: PCT/JP2005/023253

§ 371 (c)(1),
(2), (4) Date: Jun. 19, 2007

(87) PCT Pub. No.: WO2006/068082

PCT Pub. Date: Jun. 29, 2006

(65) Prior Publication Data

US 2008/0006897 A1  Jan. 10, 2008

(30) Foreign Application Priority Data

Dec. 22, 2004  (JP)  ............................ 2004-371133

(51) Int. Cl.
*H01L 29/00* (2006.01)
(52) U.S. Cl. ............... 257/536; 257/539; 257/E27.016; 257/E29.066
(58) Field of Classification Search ........... 257/379, 257/536, 537, 539, 541, 542, 572, E27.019, 257/E29.066
See application file for complete search history.

(56) References Cited

U.S. PATENT DOCUMENTS

| 4,760,434 A | 7/1988 | Tsuzuki et al. |
| 5,448,092 A | 9/1995 | Okabe et al. |
| 5,883,402 A * | 3/1999 | Omura et al. ............... 257/146 |

FOREIGN PATENT DOCUMENTS

| JP | 5-59118 | 4/1993 |
| JP | 6-77397 | 3/1994 |
| JP | 10-116987 | 5/1998 |
| JP | 2000-31290 | 1/2000 |
| JP | 2000-338146 | 12/2000 |
| JP | 2004-63606 | 2/2004 |
| JP | 2005-39948 | 2/2005 |

* cited by examiner

*Primary Examiner*—Hoai V Pham
(74) *Attorney, Agent, or Firm*—Leydig, Voit & Mayer, Ltd.

(57) ABSTRACT

A semiconductor device accurately monitoring temperature of a semiconductor chip even in a noisy environment, while not requiring a highly accurate detection circuit. A PTC element is bonded onto an IGBT chip. Then, a constant current flows from a constant current source through the PTC element, and an output voltage of the PTC element is detected by a voltage monitor. When output voltage increases, a voltage applied to a gate electrode by a detection circuit is decreased. Since the PTC element is directly arranged on the IGBT chip, the temperature of the IGBT chip can be monitored with high accuracy. Further, since the change in output voltage of the PTC element per 1° C. is large, a highly accurate detection circuit is not necessary, thereby allowing accurate monitoring of the temperature of the IGBT chip even in a noisy environment.

13 Claims, 10 Drawing Sheets

8 : EMITTER ELECTRODE
9 : PTC ELEMENT
11a, 11b : COPPER FOIL ELECTRODE
12 : PTC MATERIAL
22 : CONSTANT CURRENT SOURCE
23 : VOLTAGE MONITOR

8 : EMITTER ELECTRODE
9 : PTC ELEMENT
11a, 11b : COPPER FOIL ELECTRODE
12 : PTC MATERIAL
22 : CONSTANT CURRENT SOURCE
23 : VOLTAGE MONITOR

F I G. 5
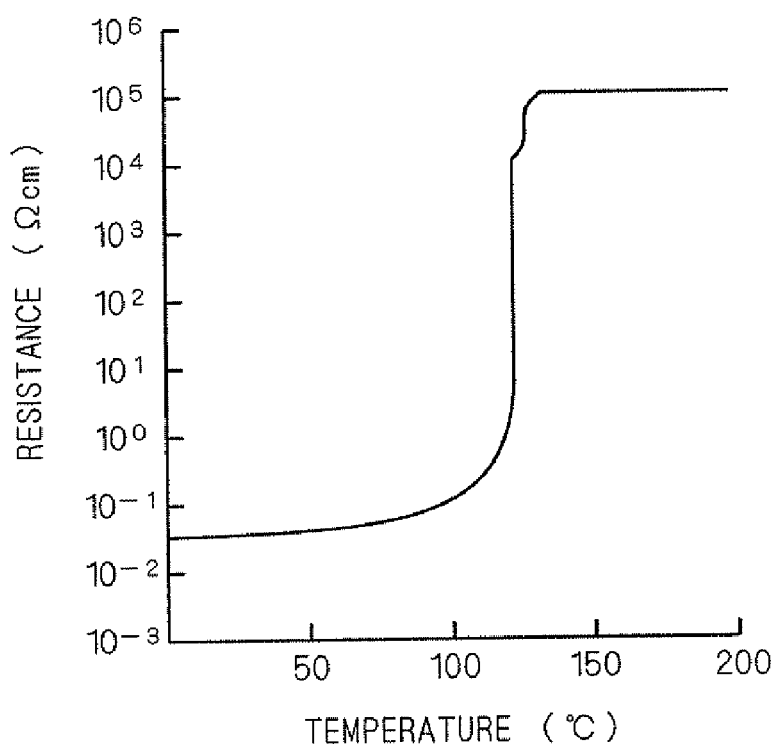
F I G. 6
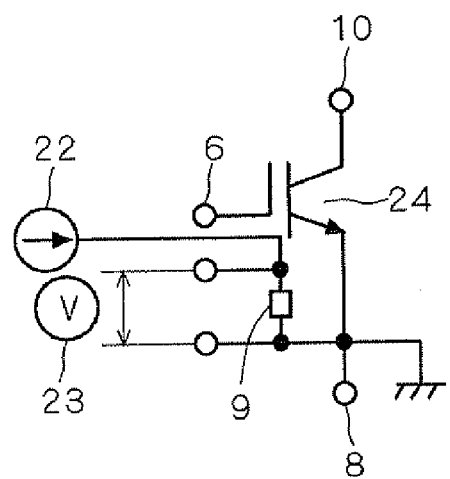

13 : VIBRATION EXCITER
14 : GOLD BUMP

15: GEL 20, 21: WIRE

SEMICONDUCTOR DEVICE

TECHNICAL FIELD

The present invention relates to a semiconductor device including a temperature sensor.

BACKGROUND ART

In a semiconductor device as a power device which is in heavy use for power control, a temperature rises with increase in operating current. There are some cases where the semiconductor device is extremely heavily used, and in such cases, the rising temperature might exceed a threshold limit to cause multifunction of the semiconductor device or lead to damage thereto.

Therefore, for example in an invention disclosed in Patent Document 1, a semiconductor device is designed such that a diode temperature sensor is formed inside the semiconductor chip to monitor a temperature of a semiconductor chip, and in the case of detecting an extreme temperature rise, the operation of the semiconductor device is controlled.

Patent Document 1: Japanese Patent Laid-Open No. 2000-31290

As a conventionally used temperature sensor other than this sensor, an IC temperature sensor can be cited. These temperature sensors allow a minute electric current to flow and then monitor an output voltage so as to detect a temperature. Both sensors have the characteristic of being capable of measuring a large range of temperatures, but an output voltage per 1° C. changes to a small degree and an amount of such a change is several mV.

Therefore, detection of the amount of change requires provision of a highly accurate detection circuit capable of detecting an output voltage difference of several mV. Further, there is a problem in that, since an environment where the semiconductor device is used is a high-noise environment, the minute electric current is drowned out by the noise and the temperature cannot be sufficiently monitored.

Moreover, although the diode temperature sensor can be directly set on the semiconductor chip, this makes variations large and causes a problem in terms of accuracy in temperature measurement.

The IC temperature sensor is accurate in temperature measurement, but cannot be directly set on the semiconductor chip, and hence there is no choice but to measure the temperature via a heat conduction material. For this reason, heat resistance of the IC temperature sensor in the semiconductor chip becomes a problem, thereby making it difficult also for this sensor to perform accurate temperature measurement.

Since the respective temperature sensors have the problems as thus described, it is difficult for a semiconductor device using either of such temperature sensors to accurately monitor a temperature of a semiconductor chip in a noise environment.

DISCLOSURE OF INVENTION

An object of the present invention is to provide a semiconductor device capable of accurately monitoring a temperature of a semiconductor chip even in a noise environment, while not requiring a highly accurate detection circuit.

An aspect of a semiconductor device according to the present invention comprises: a semiconductor chip having an emitter-side main electrode and a collector-side main electrode; and a variable resistor element, which is bonded onto said emitter-side main electrode and whose resistance value changes according to a temperature, wherein said variable resistor element includes a first electrode formed on a part of the surface or the inside of said variable resistor element at least, and a second electrode formed on a part of the surface or the inside, except for said first electrode, of said variable resistor element at least.

According to the aspect of the semiconductor device in the present invention, since a variable resistor element is arranged on an emitter electrode as a heat generation source, the temperature of the semiconductor chip can be detected with high accuracy by detecting a change in resistance of the variable resistor element. Moreover, adoption of a variable resistor element, in which an amount of change in resistance per degree Celsius is large, eliminates the need for a highly accurate detection circuit, and allows highly accurate detection of the temperature of the semiconductor chip even in a noise environment. Furthermore, bonding of the variable resistor element onto a ground electrode leads to reduction in influence exerted by the electric field on the variable resistor element, making it possible to perform highly accurate temperature detection.

The object, characteristics, aspects and advantages of the present invention become more apparent by the following specific descriptions and attached drawings.

BRIEF DESCRIPTION OF DRAWINGS

FIG. 5 is a view showing the temperature-resistivity characteristic of the PTC element according to Embodiment 1.

FIG. 6 is an equivalent circuit diagram of the semiconductor device according to Embodiment 1.

BEST MODE FOR CARRYING OUT THE INVENTION

Embodiment 1

Figure 1:
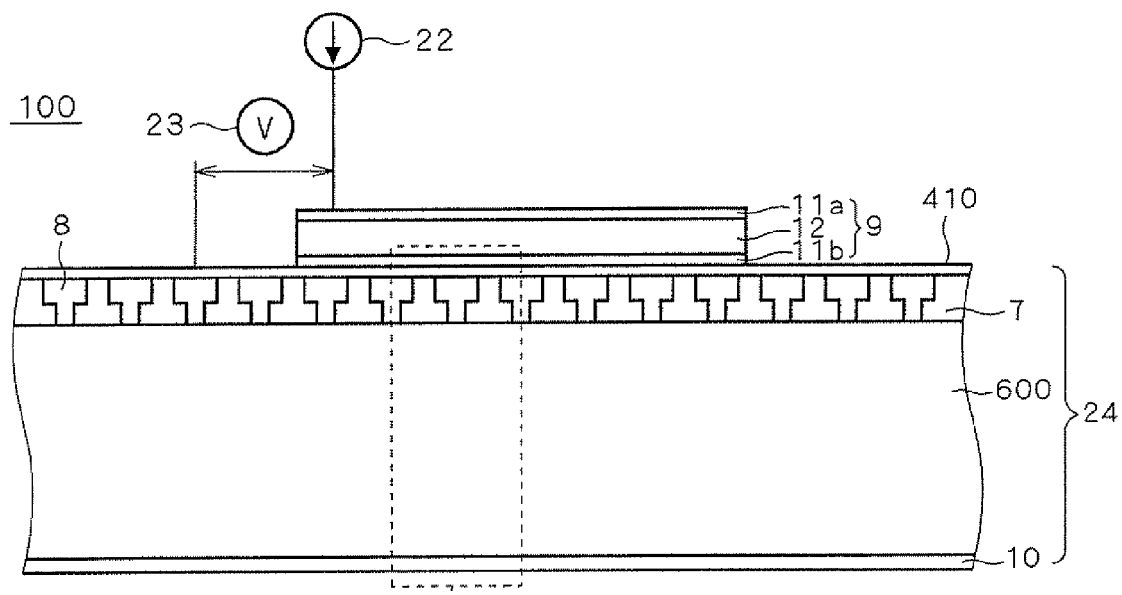
FIG. 1 is a sectional view showing a configuration of a semiconductor device according to Embodiment 1.

FIG. 1 is a sectional view showing a configuration of a semiconductor device 100 according to present Embodiment 1. In the semiconductor device 100 according to present Embodiment 1, a PTC (positive temperature coefficient) element (PTC temperature sensor) 9 is bonded to an IGBT (insulated gate bipolar transistor) chip 24 as a kind of semiconductor chips.

A silicon oxide film 7 is formed on the top surface of a semiconductor layer 600. A plurality of emitter electrodes 8 are formed in the silicon oxide film 7.

Here, the emitter electrodes 8 are usually connected to a ground potential.

An aluminum layer 410 for connecting the plurality of emitter electrodes 8 is formed on the emitter electrodes 8. Here, the combination of the plurality of emitter electrodes 8 and the aluminum layer 410 is understood as an emitter-side main electrode.

A PTC element 9 is bonded onto the aluminum layer 410. The PTC element 9 is a variable resistor element having a positive temperature coefficient in which a resistivity changes according to a temperature. A collector electrode 10 is formed on the opposite side surface to the surface onto which the PTC element 9 is bonded in the semiconductor layer 600. Here, the collector electrode 10 is understood as a collector side main electrode.

A constant current source 22 is connected to the PTC element 9. A voltage monitor 23 for monitoring an output voltage of the PTC element 9 is connected to the PTC element 9.

Figure 2:
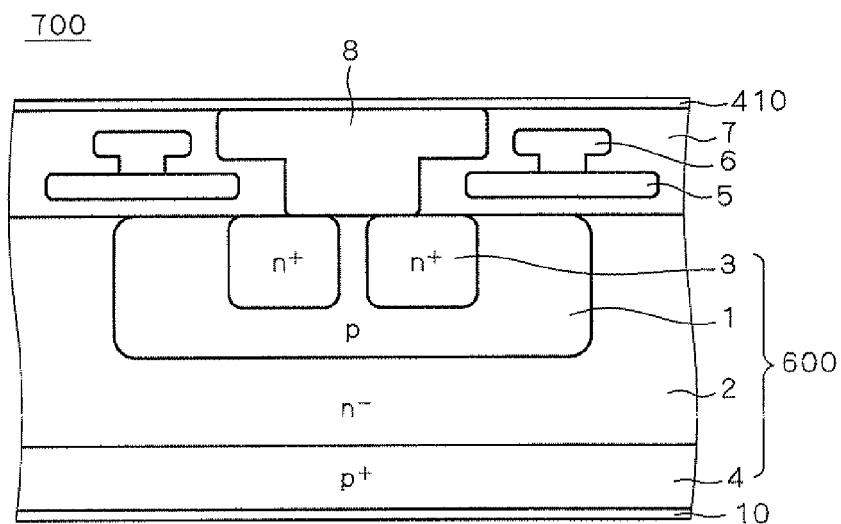
FIG. 2 is an expanded sectional view showing the configuration of the semiconductor device according to Embodiment 1.

Next, the configuration of the semiconductor device 100 shown in FIG. 1 is more specifically described by means of FIG. 2. FIG. 2 is an expanded sectional view showing the configuration of the semiconductor device 100 in the portion 700 of FIG. 1.

An n-type semiconductor layer (n$^-$ layer) 2 having a low impurity concentration is formed on a p(p$^+$)-type semiconductor substrate 4 having a high impurity concentration. A p-type semiconductor region (p region) 1 is formed in a surface layer part of the n$^-$ layer 2. An n-type semiconductor region (n$^+$ region) 3 having a high impurity concentration is formed in a surface layer part of the p region 1.

The silicon oxide film 7 is formed on the n$^-$ layer 2. A polysilicon gate 5 is formed inside the silicon oxide film 7. The polysilicon gate 5 is formed above the p region 1 sandwiched between the n$^-$ layer 2 and the n$^+$ region 3. A gate electrode 6 is formed on the polysilicon gate 5. The emitter electrode (current output electrode) 8 is formed inside the silicon oxide film 7 so as to be in contact with the n$^+$ region 3. The aluminum layer 410 is formed on the silicon oxide film 7. The collector electrode 10 is formed on the rear surface of the p-type semiconductor substrate 4.

Next, the configuration of the PTC element 9 is specifically described with reference to FIG. 1. The PTC element 9 includes: a PTC material (PTC member having a positive temperature coefficient) 12; a copper foil electrode 11a (first electrode) formed on one main surface of the PTC material 12; and a copper foil electrode 11b (second electrode) formed on the other main surface of the PTC material 12. Namely, the copper foil electrodes 11a (positive) and 11b (negative) are fusion-bonded on the respective main surfaces of the PTC material 12. The respective thicknesses of the copper foil electrodes 11a, 11b are, for example, from 1 to 100 µm. Here, the PTC material 12 is obtained by mixing conductive particles into an organic polymer.

Here, the PTC material 12 is formed so as to have a thickness of not smaller than 0.1 mm and not larger than 0.37 mm.

When a voltage of not smaller than 100 V/mm is applied to the PTC material 12, a resistance value sharply decreases in principle, thereby making the use as the temperature sensor difficult.

In many cases, the power supply connected to the PTC element 9 is a constant voltage power supply on the order of 10 V. Therefore, when the thickness of the PTC material 12 is not larger than 0.1 mm, a voltage of not smaller than 100 V/mm is applied. It is thus necessary to make the film thickness of the PTC material 12 not smaller than 0.1 mm in order to use the PTC element 9 as the temperature sensor.

Further, as described later, when the PTC element 9 is used as the temperature sensor, it is necessary to make the film thickness of the PTC material 12 not larger than 0.37 mm so that the time for detecting a temperature rise of the semiconductor chip is not more than 0.5 seconds.

Figure 3:
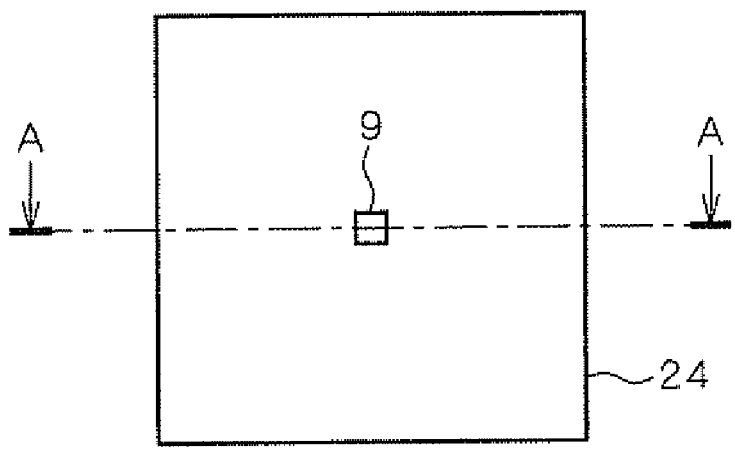
FIG. 3 is a top view for explaining a bonded position of a PTC element according to Embodiment 1.

Next, the bonding position of the PTC element 9 is described with reference to FIGS. 3 and 4. FIG. 3 is a top view for explaining the bonding position of the PTC element 9 according to present Embodiment 1. Further, FIG. 4 is a sectional view along the A-A line of FIG. 3.

Figure 4:
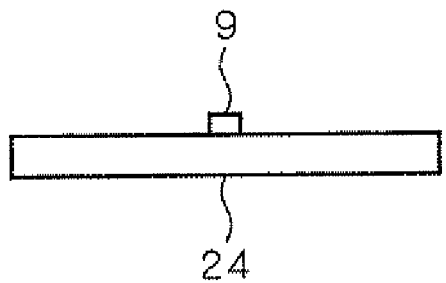
FIG. 4 is a sectional view for explaining the bonded position of the PTC element according to Embodiment 1.

As shown in FIGS. 3 and 4, the PTC element 9 is arranged in the central part of the IGBT chip 24 as seen from the top. The temperature of the IGBT chip 24 is made highest in its central part. This is because heat is released in the peripheral part toward the outside thereof. For detecting the maximum temperature with the highest accuracy, it is desirable to detect the temperature in the central part of the IGBT chip 24 where the temperature is made highest, and hence the PTC element 9 is bonded to the central part of the chip.

Next described are characteristics of the PTC element 9 having the above-described configuration with reference to FIG. 5. FIG. 5 is a view showing the temperature (abscissa axis)—resistivity (ordinate axis) characteristic of the PTC element 9.

The PTC material 12 is an organic polymer compound including polyethylene as an organic polymer and tangsten carbide particles. It is found from FIG. 5 that the PTC material 12 has a positive temperature coefficient and its resistivity sharply rises at the boundary of 130° C. As a result, whether the temperature is higher or lower than 130° C. can be detected by the PTC element 9.

Next, the operation of the semiconductor device 100 according to present Embodiment 1 is described with reference to FIGS. 1, 2 and 6. FIG. 6 is an equivalent circuit diagram of the semiconductor device 100 configured as described above. The constituents corresponding to those of FIG. 1 are provided with the same numerals as in FIG. 1.

The emitter electrode 8 of the IGBT chip 24 is grounded, and connected with one end of the PTC element 9. The other end of the PTC element 9 is connected to the constant current source 22. The voltage between one end and the other end of the PTC element 9 is monitored by a voltage monitor 23.

A positive voltage is applied to the collector electrode 10 (see FIG. 2), and the emitter electrode 8 is grounded. When, in this state, a positive voltage with respect to the emitter electrode 8 is applied to the gate electrode 6, an n-type channel where electrons have been gathered is formed in the p-region 1 portion immediately below the polysilicon gate 5.

Electrons supplied from the emitter electrode 8 flow along a path leading to the p-type semiconductor substrate 4 and the collector electrode 10 via an n+ layer 3, the n-type channel formed inside the p region l and the n− layer 2. In this process, in synchronization with flowing of excess electrons into the n− layer 2, holes are supplied from the p-type semiconductor substrate 4 containing a large amount of impurities to the n− layer 2. Namely, a current flows in the form of combining electrons with holes in the n− layer 2, and hence the device comes into a switch-on state. When the application of the voltage to the gate electrode 6 is stopped, the foregoing phenomenon does not occur, and hence the device comes into a switch-off state.

Since the current does not flow between the emitter electrode 8 and the collector electrode 10 in the switch-off state and the voltage becomes small between the emitter electrode 8 and the collector electrode 10 in the switch-on state, heat generation is small. However, in shifting from the switch-on state to the switch-off state or from the switch-off state to the switch-on state, both the current and the voltage are generated between the emitter electrode 8 and the collector electrode 10 to generate Joule heat. For avoiding thermal damage to the semiconductor device 100 due to the Joule heat, it is necessary to control the temperature to a temperature of not higher than 125° C., 130° C., 150° C. or 175° C.

Accordingly, a current is allowed to flow through the PTC element 9 and its voltage value is read for detecting the temperature of the IGBT chip 24.

Figure 7:
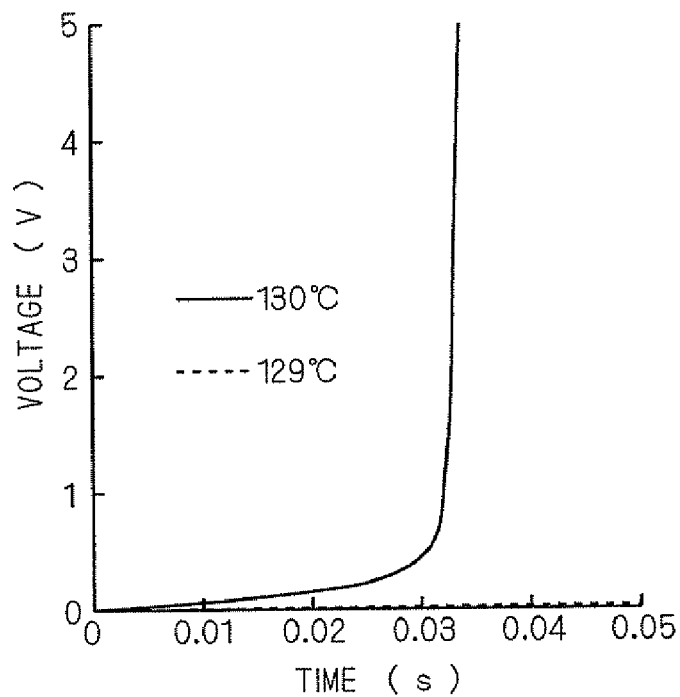
FIG. 7 is a view showing a simulation result of an output voltage of the PTC element according to Embodiment 1.

FIG. 7 is a view showing a simulation result of the semiconductor device 100 according to Embodiment 1.

The abscissa axis represents the elapsed time (unit: s) from the start of temperature rise of the semiconductor chip, and the ordinate axis represents the voltage (output voltage, unit: V) between both ends of the PTC element 9.

Here shown are changes in voltage of the PTC element 9 in the case (solid line) of temperature rise of the semiconductor chip from 100° C. to 130° C. and the case (broken line) of the temperature rise from 100° C. to 129° C. A current of 1 mA is allowed to flow through the PTC element 9.

As found from FIG. 7, there is almost no change in voltage of the PTC element 9 even when the temperature rises from 100° C. to 129° C., However, There is a change in voltage by several V when the temperature rises from 100° C. to 130° C. Since such a voltage change occurs, a voltage change can be sufficiently detected even by a simple and inexpensive detection circuit.

Figure 8:
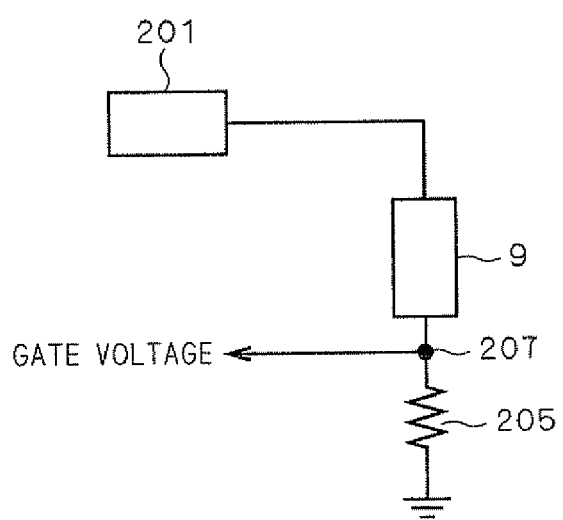
FIG. 8 is a circuit view showing an example of configurations of a detection circuit according to Embodiment 1.

FIG. 8 is a circuit diagram showing an example of configurations of the detection circuit. One end of the PTC element 9 is connected to a power supply voltage 201. The other end of the PTC element 9 is connected to one end of a resistance 205 at a connecting point 207. The other end of the resistance 205 is grounded. A voltage at the connecting point 207 is outputted as a gate voltage to the gate electrode 6 of the IGBT chip 24.

Next, the operation of the detection circuit is described with reference to FIG. 8. When the temperature of the IGBT chip 24 becomes not lower than 130° C., the resistance value of the PTC element 9 increases, and thereby the voltage at the connecting point 207 decreases to be not higher than a turn-on voltage of the semiconductor chip. When the voltage becomes not higher than the turn-on voltage, the current stops flowing between the collector and emitter electrodes and the temperature of the IGBT chip 24 then stops rising so that thermal damage is prevented.

It is to be noted that the sizes of the resistance value of the resistance 205 and the power voltage 201 are set to appropriate values such that the gate voltage outputted from the connecting point 207 is not higher than the turn-on voltage of the IGBT chip 24 when the resistance value of the PCT element 9 increases.

In the case of detecting the temperature rise of the IGBT chip 24 with use of the detection circuit as thus described, the thermal damage to the IGBT chip 24 can be more effectively prevented when the temperature rise can be detected in a shorter period of time.

Figure 9:
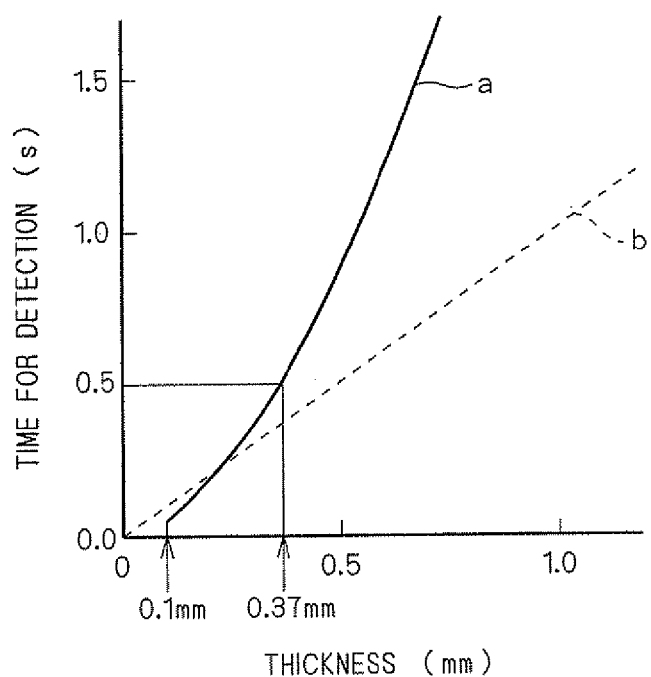
FIG. 9 is a view showing a calculation result of the time for detection by the detection circuit with respect to the film thickness of a PTC material according to Embodiment 1.

FIG. 9 is a view showing a simulation result of the relation between the film thickness of the PTC material 12 and the time for detection by the detection circuit when the PTC element 9 is used in the detection circuit.

A line "a" indicates the time needed for detecting the temperature rise by the detection circuit after heat generation of some kind occurred for 100 μs during the steady operation of the IGBT chip 24 at 100° C. and the temperature of the IGBT chip 24 rose up to 150° C. due to the heat generation. As shown in FIG. 9, the time for detection by the detection circuit is linked with the thickness of the PTC material 12 in the PTC element 9.

Further, a line "b" in FIG. 9 is an auxiliary straight line indicating a case where the thickness of the PTC material 12 is directly proportional to the time for detection.

As shown in FIG. 9, it is found that the time for detection is shortened with decrease in thickness of the PTC material 12. In actual application, the time for detection is desirably not more than 0.5 s, which as a result requires the thickness of the PTC material 12 to be not larger than 0.37 mm.

Here, FIG. 9 shows the time for detection when the foregoing film thickness of the PTC material 12 is 0.1 mm.

Next described is a method for manufacturing the semiconductor device 100 according to present Embodiment 1.

First, the IGBT chip 24 is manufactured by an ordinary production process. Subsequently, the PTC element 9 is bonded onto the IGBT chip 24. As for the place to which the PTC element 9 is bonded, since the emitter electrode 8 is often grounded and thus has a low potential, an influence exerted by the electric field on the PTC element 9 can be reduced. Therefore, the PTC element 9 is bonded onto the emitter electrode 8.

If a normal solder is used in bonding, the PTC element 9 may be damaged due to a high temperature at the time of bonding. It is thus desirable to apply a bonding means in which the temperature in bonding is not required to be high. Further, the surface of the IGBT chip 24 is usually aluminum (Al)-deposited or sputtered. Therefore, the method needs to be a bonding method capable of bonding aluminum and copper.

Figure 10:
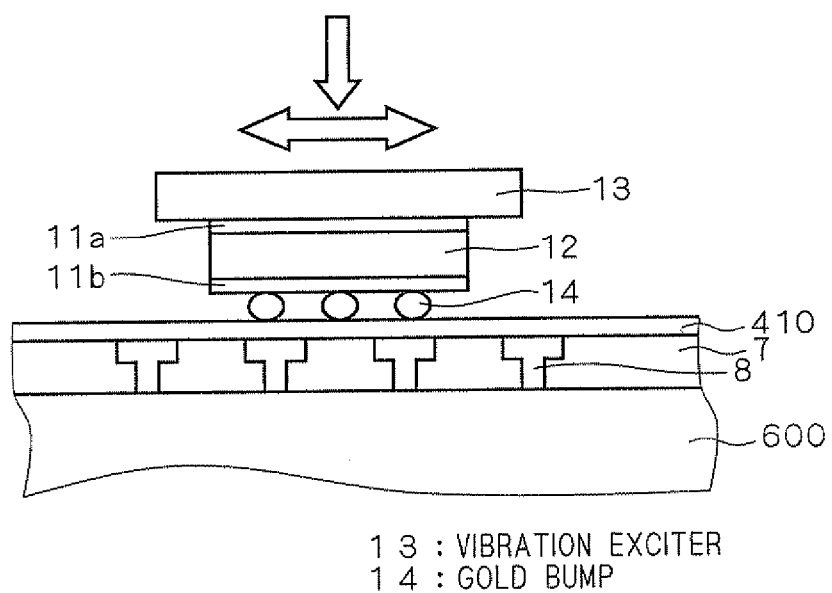
FIG. 10 is a view for explaining a bonding process of the PTC element by an ultrasonic and thermo-compression bonding method.

Accordingly, an ultrasonic and thermo-compression bonding method shown in FIG. 10 is used. FIG. 10 is a view for explaining a bonding process of the PTC element 9 by the ultrasonic and thermo-compression bonding method.

This is a method in which a gold bump (conductive brazing material) 14 is sandwiched between the copper foil electrode 11b of the PTC element 9 and the surface of the IGBT chip 24, i.e. the surface of the aluminum layer 410 on the emitter electrode 8 in present Embodiment 1, and supersonic vibration is applied to the PTC element 9 or the IGBT chip 24 through an vibration exciter 13, and in which bonding can be performed while there is almost no temperature rise. Further, in the present bonding method, it is possible to bond aluminum and copper.

Figure 11:
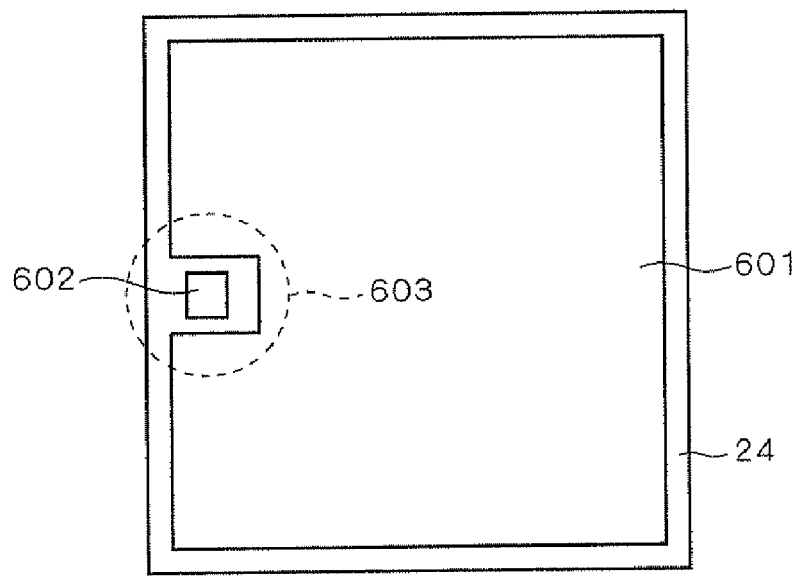
FIG. 11 is a top view showing an arrangement example of a conventional temperature sensor on an IGBT chip.

In the following, the effect of the semiconductor device 100 according to present Embodiment 1 is described. FIG. 11 is a top view showing a conventional arrangement example on a temperature sensor 602 on the IGBT chip 24. A region 601 where the emitter electrode 8 of the IGBT chip 24 is present becomes a path along which a current flows and generates heat in operation of the IGBT chip 24.

It has hitherto been impossible to arrange the temperature sensor 602 on the region 601 where the emitter electrode 8 is present. Namely, the aluminum layer 410 is typically formed on the emitter electrode 8 of the IGBT chip 24 by vapor deposition. It is generally known that bonding aluminum and copper with a solder is difficult.

Since the temperature sensor 602 cannot be arranged on the current path as the heat generation source, consequently, it has been required to newly provide an insulating space 603 and arrange the temperature sensor 602 on the insulating space 603.

This has required expansion of the region 601 by the size of the insulating space 603, causing a problem of upsizing the IGBT chip 24. Further, since the temperature sensor 602 is separated from the top of the current path as the heat generation source, it has been difficult to detect the maximum temperature of the IGBT chip 24.

In the semiconductor device 100 according to present Embodiment 1, since the ultrasonic and thermo-compression bonding method is used for bonding of the PTC element 9, it is possible to directly bond the aluminum layer 410 on the emitter electrode 8 and the copper foil electrode 11b of the PTC element 9.

Therefore, in the semiconductor device 100 according to present Embodiment 1, the PTC element 9 can be arranged on the region 601 where the emitter electrode 8 of the IGBT chip 24 is present As a result, the temperature of the IGBT chip 24 can be monitored with high accuracy without upsizing the IGBT chip 24.

Further, since a change in output voltage per 1° C. is large in the PTC element 9, a highly accurate detection circuit is not necessary, thereby allowing accurate monitoring of the temperature of the IGBT chip 24 even in a noise environment.

The PTC element 9 has the PTC material 12 formed while being sandwiched between the copper foil electrode 11a and the copper foil electrode 11b, and the film thickness of the PTC material 12 is not smaller than 0.1 mm and not larger than 0.37 mm. This allows suppression of an error in temperature measurement and making the time for detection by the detection circuit not more than 0.5 s.

Further, since the emitter electrode 8 is often grounded and thus has a low potential, it is possible to reduce an influence exerted by the electric field on the PTC element 9.

In the semiconductor device 100 according to present Embodiment 1, since the PTC element 9 is bonded by the ultrasonic and thermo-compression bonding method, the temperature does not rise, thereby enabling direct bonding between the aluminum layer 410 on the emitter electrode 8 and the copper foil electrode 11b of the PTC element 9.

As a result, it is possible to directly bond PTC element 9 and the p-type semiconductor substrate 4 in no danger of damage due to application of heat at a high temperature.

In the semiconductor device 100 according to present Embodiment 1, the PTC element 9 is arranged in the central part of the main surface of the IGBT chip 24. This allows detection of the maximum temperature of the semiconductor device 100 in the most accurate manner.

In the semiconductor device 100 according to present Embodiment 1, the PTC element 9 is bonded through the gold bump as the conductive brazing material. It is thereby possible to increase bonding force between the PTC element 9 and the IGBT chip 24.

It is to be noted that as shown in FIG. 1, the PTC element 9 includes the copper foil electrodes 11a and 11b on the whole area of its surface. However, the copper foil electrode 11a may be formed on at least part of the surface or at least part of the inside of the PTC element 9, and the copper foil electrode 11b may be formed on at least of the surface or at least part of the electrode, except for the region where the copper foil electrode 11a was formed, of the PTC element 9. Even with such a configuration, the temperature of the IGBT chip 24 can be monitored with high accuracy by allowing a constant current to flow through the PTC material 12 sandwiched between the copper foil electrodes 11a, 11b and monitoring a voltage change.

Further, although the case was described in present Embodiment 1 where the resistance of the PTC material 12 increases at a temperature of 130° C., detection can also be performed at another temperature, such as 125° C., 150° C. or 175° C., by changing the melting point of the organic polymer. Further, polyethylene may be an HD (high-density) polyethylene or a LD (low-density) polyethylene.

Moreover, although tangsten carbide was used as the conductive particles of the PTC material 12 in present Embodiment 1, the conductive particles may be a metal material such as nickel, tangsten, molybdenum, cobalt, copper, silver or aluminum, or carbon black.

Furthermore, although polyethylene was used as the organic polymer of the PTC material 12, for example, polypropylene, polyvinylidine difluoride, polyvinyl chloride, poly vinyl acetate, ionomer, or a copolymer of these may be used.

Although the IGBT chip 24 was described in present Embodiment 1, it goes without saying that this embodiment is applicable to another semiconductor chip, such as a thyristor, a GTO (Gate Turn-Off Thyristor), a power MOSFET, a bipolar transistor, and a diode.

Embodiment 2

Figure 12:
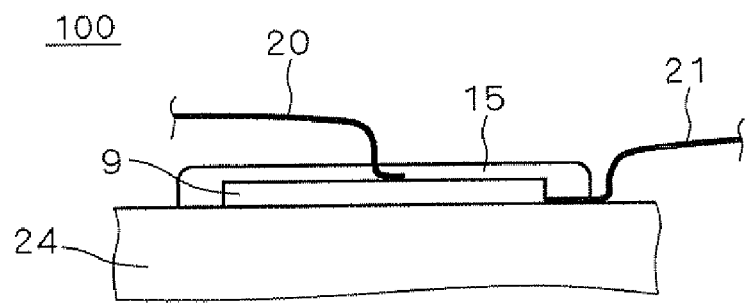
FIG. 12 is a sectional view showing a configuration of the vicinity of a PTC element of a semiconductor device according to Embodiment 2.

FIG. 12 is a sectional view showing a configuration of the vicinity of the PTC element 9 of the semiconductor device 100 according to present Embodiment 2.

Wires 20, 21 for allowing a current to flow through the PTC element 9 are connected respectively to the copper foil electrodes 11a, 11b of the PTC element 9. A gel (protective film) 15 is then formed so as to cover the PTC element 9.

The PTC material 12 (see FIG. 1) includes the organic polymer. Therefore, when a transient temperature rise continues, the organic polymer melts, which might cause deformation. Further, the PTC material 12 is vulnerable to moisture, and when the PTC material 12 absorbs moisture, its physical properties may change. Further, it is desirable to avoid damage exerted by mechanical external force.

In present Embodiment 2, as shown in FIG. 12, the PTC element 9 is covered by the gel 15, for example. This enables prevention of deterioration in characteristic due to absorption of moisture from the outside and damage by external force.

It is to be noted that, other than covering by the gel 15, another molding member, such as an epoxy resin, may be used for molding.

Embodiment 3

Although the gold bump 14 was used between the copper foil electrodes 11a, 11b of the PTC element 9 and the IGBT chip 24 (see FIG. 10) in present Embodiment 1, the copper foil electrodes 11a, 11b and the surface of the IGBT chip 24 may be directly bonded to each other by the ultrasonic and thermo-compression bonding method without the use of the gold bump 14. Or an Al bump may be used in place of the gold bump 14.

In present Embodiment 3, the PTC element 9 and the IGBT chip 24 are directly bonded to each other. With the gold bump 14 not used, it is possible to reduce production cost.

In present Embodiment 3, bonding is performed by the ultrasonic and thermo-compression bonding method. Hence bonding is possible without a temperature rise. Bonding is possible with the surface having been aluminum-deposited or sputtered as often done on the surface of a semiconductor chip, thereby enabling an increase in bonding force.

Embodiment 4

In the semiconductor device 100 according to present Embodiment 4, a low melting point solder is used for bonding between the copper foil electrodes 11a, 11b of the PTC element 9 and the IGBT chip 24 as shown in FIG. 1.

The use of the low melting point solder with a lower melting point than that of the PTC material 12 permits prevention of damage to the PTC material 12. Further, since a thermal conductivity of the low melting point solder is relatively high, it is possible to improve performance of temperature detection.

Examples of the low melting point solder to be used may include Anatomical Alloy, Lipowitz's Alloy, Wood Alloy, Rose Alloy, Darcet Alloy, Newton Alloy, Cerrosafe Alloy, and D Alloy. Further, the use of a flux for bonding to an aluminum surface allows bonding to the aluminum-deposited or sputtered surface.

Embodiment 5

In the semiconductor device 100 according to present Embodiment 5, a conductive paste is used for bonding of the copper foil electrodes 11a, 11b of the PTC element 9 and the IGBT chip 24 as shown in FIG. 1.

The use of the conductive paste allows bonding of the PTC element 9 at a temperature not higher than the melting point of the PTC material 12 without a temperature rise, so as to prevent damage to the PTC material 12. Further, bonding to the aluminum-deposited or sputtered surface is also possible.

Embodiment 6

In the semiconductor device 100 according to present Embodiment 6, a non-organic material including $BaTiO_3$ as a main material is used as the PTC material 12 of the PTC element 9 as shown in FIG. 1. When Ba is replaced by positive trivalent La, Ce, Pr, Nd, Sm, Gd, Ho or the like, or Ti is replaced by positive pentavalent Nb, Ta, Sb, Bi or the like, electrons or halls are formed to give a semiconductor. When the temperature exceeds the Curie point, only crystal particles are insulated to increase a resistivity, thereby expressing PTC. As a method for controlling the temperature at which the resistivity sharply increases, there is a method where Ba is replaced by positive divalent Mg, Ca, Sr, Pb or the like, or Ti is replaced by positive tetravalent Hf, Sn, Zr or the like, to shift the Curie point so that the PTC characteristic according thereto can be obtained.

The effect of using such a material as the PTC material 12 is that, since controlling the temperature at which the resistivity sharply increases is easy, such a PTC characteristic can be easily obtained that the voltage change becomes larger at 125° C., 130° C., 150° C., 175° C. or another temperature.

Further, since the material is a kind of ceramic, it is heat-resistant and hence a normal solder or a lead-free solder can be used. Since the surface of the IGBT chip 24 is typically Al-deposited or sputtered, the aluminum surface is Ni plated or Ni vapor deposited for the purpose of making aluminum and copper solder-bonded to each other, whereby copper and the aluminum surface can be solder-bonded to each other.

Examples of the non-organic PTC material 12 other than this may include: a material made of $(V_{1-x}Cr)_2O_3$ obtained by using $V_2O_3$ as a main material and replacing part of V by Cr; a material obtained by making Bi and $TiO_2$ composite; a material obtained by making Bi, PbO, $B_2O_3$ and $SiO_2$ composite; and a material obtained by making metal powder composite with ceramic and low melting point glass.

Embodiment 7

In the semiconductor device 100 according to present Embodiment 7, a conductive brazing material is used for bonding between the copper foil electrodes 11a, 11b of the PTC element 9 and the semiconductor chip as shown in FIG. 1.

The use of the conductive brazing material allows production of the semiconductor device 100 having strong bonding force and excellent thermal transfer properties.

Embodiment 8

Figure 13:
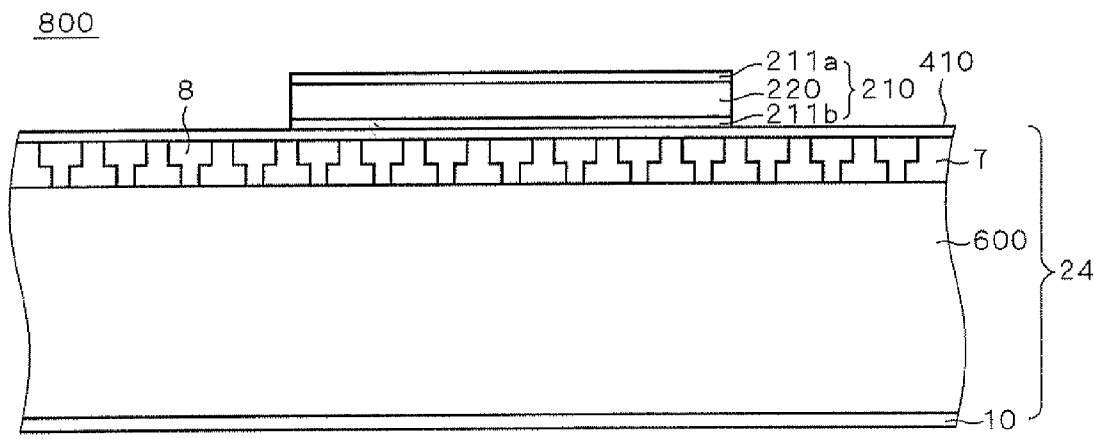
FIG. 13 is a sectional view showing a configuration of a semiconductor device according to Embodiment 8.

FIG. 13 is a sectional view showing a configuration of a semiconductor device 800 according to present Embodiment 8. In the semiconductor device 800 according to present Embodiment 8, an NTC (negative temperature coefficient) element (NTC temperature sensor) 210 is used in place of the PTC element 9. The NTC element 210 is a variable resistor element whose resistance value changes according to the temperature and which has a negative temperature coefficient. Further, the configuration of the IGBT chip 24 portion is the same as the configuration shown in FIG. 2.

Other constituents are the same as those of the semiconductor device 100 according to Embodiment 1, and the identical constituents are provided with the identical symbols as in Embodiment 1 so as to omit repeated description.

Next, the configuration of the NTC element 210 is specifically described with reference to FIG. 13. The NTC element 210 includes; an NTC material 220 (NTC member having a negative temperature coefficient), a copper foil electrode 211a (first electrode) formed on one main surface of the NTC material 210; and a copper foil electrode 211b (second electrode) formed on the other main surface of the NTC material 220. Namely, the copper foil electrodes 211a (positive), 211b (negative) are bonded to both main surfaces of the NTC material 220. The thickness of the copper foil electrodes 211a, 211b is from 1 to 100 μm, for example.

Since the emitter electrode 8 is often grounded and thus has a low potential, an influence exerted by the electric field on the NTC element 210 can be reduced. Therefore, the copper foil electrode 211b of the NTC element 210 is bonded onto the emitter electrode 8.

More specifically, the bonding is made on the aluminum layer 410 aluminum-deposited or sputtered on the emitter electrode 8. Since a solder cannot be normally used for bonding onto the aluminum layer 410, a conductive paste, especially a silver paste having large thermal conductivity and electrical conductivity is used for the bonding. Here, an insulating layer is not provided between the NTC element 210 and the aluminum layer 410. This enables improvement in thermal transfer properties. Further, the NTC material 220 is composed of Mn, Ni, or Co, or includes Mn, Ni, Co, or Fe as a main material.

It is to be noted that the arrangement position of the NTC element 210 on the IGBT chip 24 and the like are the same as those in Embodiment 1 (see FIGS. 3 and 4).

Figure 14:
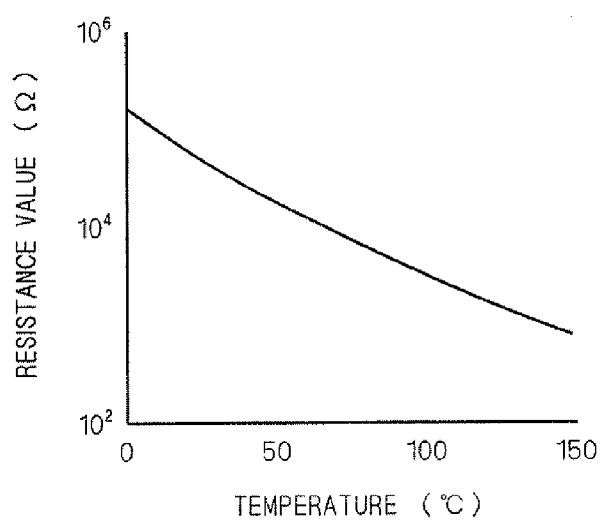
FIG. 14 is a view showing the temperature-resistivity characteristic of an NTC element according to Embodiment 8.

FIG. 14 is a view showing the temperature (abscissa axis)—resistance value (ordinate axis) characteristic of the NTC element 210. It is found from FIG. 14 that the resistance value of the NTC material 220 smoothly decreases with increase in its temperature. Namely, the NTC material 220 has a negative temperature coefficient with respect to the temperature.

The effect of using such a material is that, since the resistance value smoothly decreases with respect to the temperature, it is possible to monitor a temperature change of a semiconductor chip not only at a point of temperature but also in a large temperature range, which is different from the PTC material 12 whose resistance value sharply changes at one point as shown in FIG. 5. Further, since the resistance change with respect to the temperature change is large, the output voltage changes by dozens of mV to several mV with respect to the temperature change per 1° C., thereby eliminating the need for a highly accurate detection circuit.

Figure 15:
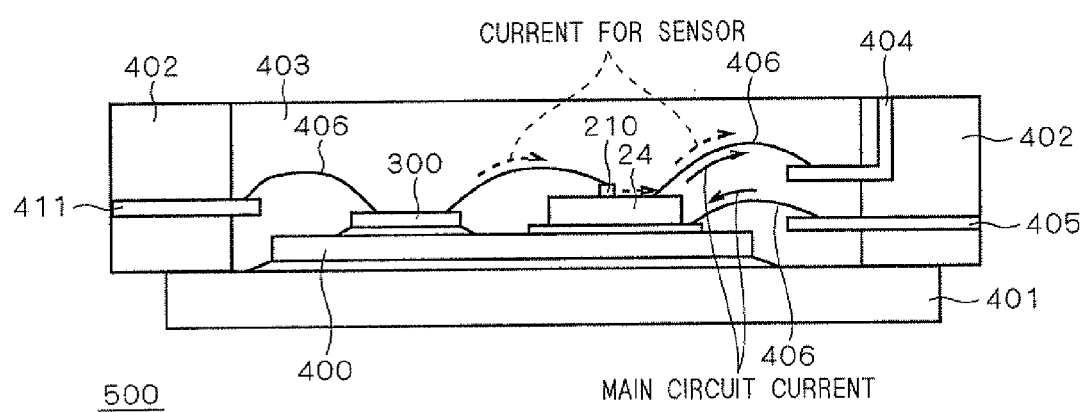
FIG. 15 is a sectional view showing a configuration of a power semiconductor module according to Embodiment 8.

Next, a power semiconductor module 500 as an example of a configuration of the semiconductor device 800 including the NTC element 210 and a detection circuit device 300 that detects the output of the NTC element 210 are described with reference to FIG. 15. FIG. 15 is a sectional view showing a configuration of the power semiconductor module 500 using the semiconductor device 800 according to present Embodiment 8.

The IGBT chip 24 and the detection circuit device 300 including a detection circuit are bonded onto an insulating substrate 400 inside a case 402. The insulating substrate 400 is bonded onto a base board 401. An insulating member 403 such as a gel or a transfer mold is inserted in the case 402 for insulation.

Terminals such as an emitter terminal 404, a collector terminal 405, and a terminal 411 are imbedded in the case 402. The external electrode, the IGBT chip 24 and the detection circuit device 300 are connected through a wire 406.

It should be noted that the configuration shown in FIG. 15 is also applicable to Embodiment 1.

Figure 16:
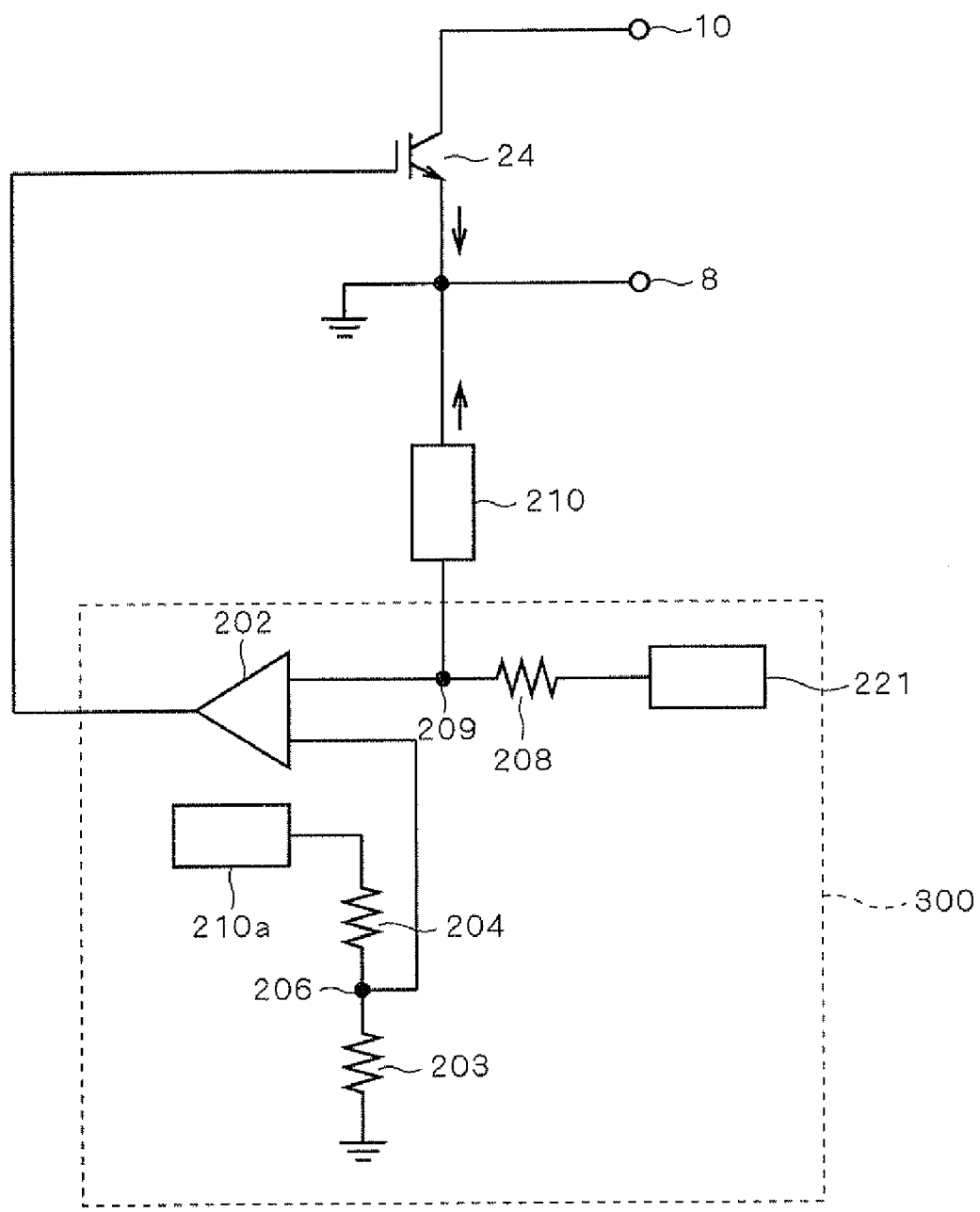
FIG. 16 is an equivalent circuit diagram showing the configuration of the power semiconductor chip module according to Embodiment 8.

FIG. 16 is an equivalent circuit diagram of the power semiconductor module 500 configured as thus described. Constituents corresponding to those of FIG. 15 are provided with the same numerals as in FIG. 15.

The emitter electrode 8 of the IGBT chip 24 is grounded. The emitter of the IGBT chip 24 is connected to one end of the NTC element 210. The other end of the NTC element 210 is connected to one end of a resistance 208 and one input of a comparator 202 at a connecting point 209, the resistance 208 and the comparator 202 configuring the detection circuit device 300.

The gate of the IGBT chip 24 is connected to the output of the comparator 202 configuring the detection circuit device 300.

Next, the circuit configuration of the detection circuit device 300 is specifically described. The other end of the resistance 208 is connected to a constant voltage power supply 221. The other input of the comparator 202 is connected to respective one ends of a resistance 203 and a resistance 204 at a connecting point 206. The other end of the resistance 203 is grounded, and the other end of the resistance 204 is connected to a constant voltage power supply 210a.

Next, the operation of the power semiconductor module 500 is described with reference to FIGS. 2, 15 and 16. First, a positive voltage is applied to the collector electrode 10, and the emitter electrode a is grounded. When, in that state, the positive voltage with respect to the emitter electrode 8 is applied to the gate electrode 6, an n-type channel where electrons have been gathered is formed in the p region 1 portion immediately below the polysilicon gate 5 (see FIG. 2).

The electrons supplied from the emitter electrode 8 flow through a path leading to the p-type semiconductor substrate 4 and the collector electrode 10 via the $n^+$ layer 3, the n-type channel formed inside the p region 1 and the $n^-$ layer 2. In this process, holes are supplied from the p-type semiconductor substrate 4 containing a large amount of impurities to the $n^-$ layer 2 in synchronization with flowing of excess electrons into the $n^-$ layer 2. Namely, the current flows in the form of combining the electrons and the holes in the $n^-$ layer 2, and hence the device comes into a switch-on state.

When the application of the voltage to the gate electrode 6 is stopped, the foregoing phenomenon does not occur, and hence the device comes into a switch-off state.

Since the current does not flow between the emitter electrode 8 and the collector electrode 10 in the switch-off state and the voltage becomes smaller between the emitter electrode 8 and the collector electrode 10 in the switch-on state, heat generation is small.

However, in shifting from the switch-on state to the switch-off state or from the switch-off state to the switch-on state, both the current and the voltage are generated between the emitter electrode 8 and the collector electrode 10, to generate Joule heat.

For avoiding thermal damage due to the Joule heat, it is necessary to control the temperature to a temperature of not higher than 125° C., 130° C., 150° C. or 175° C.

Accordingly, a current is allowed to flow through the NTC element 210 and a voltage value of the NTC element 210 is read for detecting the temperature of the IGBT chip 24.

In the power semiconductor module 500 according to present Embodiment 8, the constant voltage power supply 221 is used as the power supply to be applied to the NTC element 210. In FIG. 15, current paths of a current for a sensor (measurement current) in the NTC element 210 are indicated by dotted lines.

When the constant voltage power supply 221 is connected to the NTC element 210, the current for a sensor flows to the NTC element 210 through the resistance 208. The current for a sensor passes through the NTC material 220 from the copper foil electrode 211a, and then passes through the copper foil electrode 211b to flow into the emitter electrode 8 and the aluminum layer 410 on the top of the emitter electrode 8. The current for a sensor then flows to the emitter terminal 404.

Since an insulating layer is not provided between the NTC element 210 and the aluminum layer 410, the current for a sensor of the NTC element 210 flows directly through the emitter electrode 8 and the aluminum layer 410.

Meanwhile, a current in the main circuit (main circuit current) passes through the IGBT chip 24 from the collector external terminal 405 and flows into the emitter terminal 404.

Therefore, the main circuit current and the current for a sensor of the NTC element 210 are mixed on the surface (the emitter electrode 8 and the aluminum layer 410) of the IGBT chip 24, which may cause noise generation.

However, since the resistance value of the NTC element 210 is dozens of kΩ at room temperature and hundreds of Ω at 150° C., having much larger impedance than the chip surface, a variation in measurement current is small and an influence exerted by noise is small.

With reference to FIG. 16, a voltage (reference voltage Vr) resulting from division of the constant voltage power supply 210a by the resistances 203, 204 is outputted at the connecting point 206.

When the temperature of the IGBT chip 24 is low, the voltage value at the connecting point 207 is higher than the reference voltage Vr since the resistance value of the NTC element 210 is large (see FIG. 14). Since the resistance value of the NTC element 210 decreases with increase in temperature, the voltage at the connecting point 207 falls below the reference voltage Vr.

Upon input of the voltage higher than the reference voltage Vr, the comparator 202 outputs a signal voltage to the gate of the IGBT 24. Upon input of the signal voltage, the IGBT chip 24 is turned on to allow the current to flow between the collector and the emitter.

When the temperature of the IGBT chip 24 increases and the resistance value of the NTC element 210 falls below a certain resistance value, the voltage at the connecting point 209 falls below the reference voltage Vr at the connecting point 206, and thus the comparator 202 stops outputting the gate voltage to the gate of the IGBT chip 24. Therefore, the IGBT chip 24 is turned off and the current then does not flow between the collector and emitter so that the temperature rise of the IGBT chip 24 stops to prevent thermal damage.

It should be noted that, although the above-described relation may not be established depending upon the magnitude relation between the output voltage values of the constant voltage power supplies 221, 210a and the partial voltage resistance values, the output voltages of the constant voltage power supplies 221, 210a and the partial resistance values are to be set such that the above relation is established.

Figure 17:
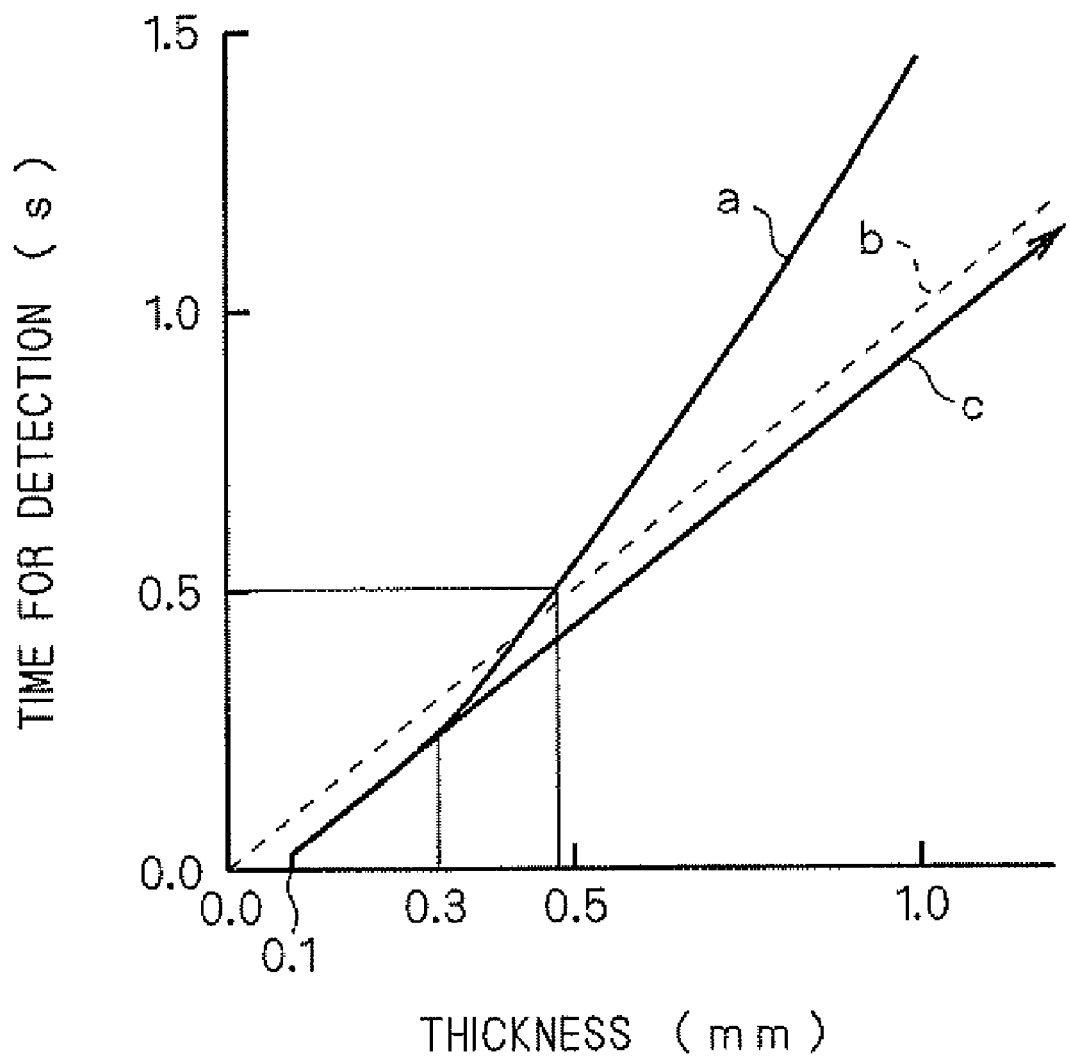
FIG. 17 is a view showing the relation between the thickness of the NTC element and the time for detection according to Embodiment 8.

The shorter the time for detecting the NTC element 210 to be used, the more effective for preventing damage to the chip. FIG. 17 is a view showing a calculation result of the time for detection by the detection circuit device 300 with respect to the thickness of the NTC material 220. A line "a" indicates the time needed for detecting the temperature rise by the detection circuit device 300 after heat generation of some kind occurred for 100 μs during the steady operation of the IGBT chip 24 at 100° C. and the temperature of the IGBT chip 24 rose up to 150° C. due to the heat generation.

As shown in FIG. 17, the time for detection by the detection circuit 300 is linked with the thickness of the NTC material 220 in the NTC element 210.

As shown in FIG. 17, it is found that the time for detection is shortened with decrease in thickness of the NTC material 220. Further, a lines "b" and "c" in FIG. 17 are auxiliary straight lines each indicating a case where the thickness of the NTC material 220 is directly proportional to the time for detection.

In actual application, the time for detection is desirably not more than 0.5 s, and it is found with reference to FIG. 17 that the time for detection can be made approximately not more than 0.5 s if the film thickness of the NTC material 220 is made not larger than 0.5 mm.

Moreover, it is found with reference to FIG. 17 that the time for detection sharply increases, departing from the proportional relation, when the thickness of the NTC material 220 exceeds 0.3 mm. Therefore, the film thickness of the NTC material 220 is desirably not larger than 0.3 mm.

Further, since the resistance value is proportional to the thickness of the NTC material 220, the thickness of the NTC material 220 needs to be made uniform in order to obtain a highly accurate temperature sensor. In order to suppress an error in the temperature measurement due to individual difference of the NTC element 210 within ±2%, the variations in resistance value of the NTC element 210 need to be kept within ±1%. It is therefore necessary to control the thickness of the NTC material 220 to be within 11%

The NTC material 220 is cut by machine work during the production, and fine-adjusted with polishing depending upon the circumstance. The thickness cannot be controlled within ±1% due to a limitation in terms of mechanical work, and thereby the individual difference becomes larger to cause deterioration in accuracy. Accordingly, the film thickness of the NTC material 220 needs to be not smaller than 0.1 mm.

The semiconductor device 800 according to the present Embodiment 8 uses the NTC element 210. Thereby, the semiconductor device 800 has the same effect as in Embodiment 1 and is capable of monitoring the temperature of the IGBT chip 24 in a wide temperature range as compared with the PTC element 9.

Further, the NTC element 210 has the NTC material 220 between the copper foil electrodes 211a, 211b, and the film thickness of the NTC material 220 is not smaller than 0.1 mm and not larger than 0.5 mm.

This allows the time for detection by the detection circuit device 300 to be not more than 0.5 s.

Further, the time for detection can further be shortened by making the film thickness of the 220 not smaller than 0.1 mm and not larger than 0.3 mm.

It is to be noted that, although the detection circuit device 300 including the equivalent circuit shown in FIG. 16 was used in the semiconductor device 800 according to present Embodiment 8, a simpler detection circuit device 300 may be used as shown in FIG. 6 of Embodiment 1.

Further, the configurations described in Embodiments 2 to 5 and 7 are also applicable to present Embodiment 8.

The invention claimed is:

1. A semiconductor device, comprising:
a semiconductor chip having an emitter-side main electrode and a collector-side main electrode;
a variable resistor element, which is bonded onto said emitter-side main electrode and which has a resistance value that changes according to temperature, wherein said variable resistor element includes
a first electrode on a part of a surface or within said variable resistor element, and
a second electrode formed on a part of the surface or within said variable resistor element, but not contacting said first electrode, of said variable resistor element, and
a power supply connected between said first and second electrodes and independent of said semiconductor chip.

2. The semiconductor device according to claim 1, wherein said variable resistor element is bonded by an ultrasonic and thermo-compression bonding.

3. The semiconductor device according to claim 1, wherein said variable resistor element is bonded with a conductive brazing material.

4. The semiconductor device according to claim 1, wherein said variable resistor element is bonded with a low melting point solder having a lower melting point than said variable resistor element.

5. The semiconductor device according to claim 1, wherein said variable resistor element is bonded with a conductive paste.

6. The semiconductor device according to claim 1, wherein said semiconductor chip includes a Ni-surface and said variable resistor element is solder-bonded to said semiconductor chip via said Ni-surface.

7. The semiconductor device according to claim 1, further comprising a protective film covering said variable resistor element.

8. The semiconductor device according to claim 1, wherein said variable resistor element is arranged in a central part of a main surface of said semiconductor chip.

9. The semiconductor device according to claim 1 to, wherein said variable resistor element has a positive temperature coefficient.

10. The semiconductor device according to claim 9, wherein
said variable resistor element further includes a variable resistor material sandwiched between said first electrode and said second electrode, and
said variable resistor material has a thickness in a range from 0.1 mm to 0.37 mm.

11. The semiconductor device according to claim 1, wherein said variable resistor element has a negative temperature coefficient.

12. The semiconductor device according to claim 11, wherein
said variable resistor element further includes a variable resistor material sandwiched between said first electrode and said second electrode, and
said variable resistor material has a thickness within a range from 0.1 mm to 0.5 mm.

13. The semiconductor device according to claim 12, wherein said variable resistor material has a thickness in a range from 0.1 mm to 0.3 mm.

* * * * *